(12) United States Patent
Parris et al.

(10) Patent No.: US 10,032,904 B2
(45) Date of Patent: Jul. 24, 2018

(54) SEMICONDUCTOR DEVICE WITH NON-ISOLATED POWER TRANSISTOR WITH INTEGRATED DIODE PROTECTION

(71) Applicant: NXP USA, Inc., Austin, TX (US)

(72) Inventors: Patrice M. Parris, Phoenix, AZ (US); Hubert M. Bode, Haar (DE); Weize Chen, Phoenix, AZ (US); Richard J. DeSouza, Chandler, AZ (US); Andreas Laudenbach, Haag (DE); Kurt U. Neugebauer, Vaterstetten (DE)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/378,458

(22) Filed: Dec. 14, 2016

(65) Prior Publication Data

US 2017/0092760 A1 Mar. 30, 2017

Related U.S. Application Data

(62) Division of application No. 14/507,063, filed on Oct. 6, 2014, now Pat. No. 9,559,097.

(51) Int. Cl.
*H01L 29/78* (2006.01)
*H01L 29/10* (2006.01)
*H01L 29/08* (2006.01)
*H01L 29/06* (2006.01)
*H01L 29/36* (2006.01)

(52) U.S. Cl.
CPC ........ *H01L 29/7823* (2013.01); *H01L 29/063* (2013.01); *H01L 29/0619* (2013.01); *H01L 29/0878* (2013.01); *H01L 29/1095* (2013.01); *H01L 29/36* (2013.01)

(58) Field of Classification Search
CPC ............ H01L 29/7835; H01L 29/0619; H01L 29/0623; H01L 29/1095; H01L 27/0727
See application file for complete search history.

(56) References Cited

U.S. PATENT DOCUMENTS

| | | | |
|---|---|---|---|
| 7,608,513 B2 | 10/2009 | Yang et al. | |
| 7,776,700 B2 | 8/2010 | Yang et al. | |
| 8,319,283 B2 | 11/2012 | Min et al. | |
| 8,330,220 B2 | 12/2012 | Khan et al. | |
| 8,575,692 B2 | 11/2013 | Yang et al. | |
| 8,664,728 B2 | 3/2014 | Yang et al. | |
| 8,681,459 B2 | 3/2014 | Neugebauer et al. | |
| 2003/0001216 A1 | 1/2003 | de Fresart | |
| 2003/0062537 A1 | 4/2003 | Sugil | |
| 2003/0218209 A1 | 11/2003 | D'Anna | |
| 2005/0051814 A1 | 3/2005 | Miyake | |
| 2006/0186507 A1* | 8/2006 | Kanda ................. | H01L 29/1083 257/491 |
| 2007/0063274 A1 | 3/2007 | Kanda | |
| 2008/0197408 A1 | 8/2008 | Disney et al. | |
| 2009/0224333 A1 | 9/2009 | Lu et al. | |
| 2010/0289057 A1* | 11/2010 | Sheu ................... | H01L 27/0251 257/133 |
| 2011/0039378 A1 | 2/2011 | Voldman | |

(Continued)

FOREIGN PATENT DOCUMENTS

KR 2000-0055068 A 9/2000

*Primary Examiner* — Nathan W Ha

(57) ABSTRACT

A semiconductor device configured with one or more integrated breakdown protection diodes in non-isolated power transistor devices and electronic apparatus, and methods for fabricating the devices.

18 Claims, 11 Drawing Sheets

(56) References Cited

U.S. PATENT DOCUMENTS

| | | |
|---|---|---|
| 2011/0248342 A1 | 10/2011 | Kim |
| 2013/0093016 A1 | 4/2013 | Ko et al. |
| 2013/0181286 A1* | 7/2013 | Zhang .................. H01L 29/4983 257/335 |
| 2013/0270606 A1 | 10/2013 | Chen et al. |
| 2013/0292764 A1* | 11/2013 | Yang ..................... H01L 29/063 257/336 |
| 2014/0001549 A1 | 1/2014 | Bode et al. |
| 2014/0027849 A1 | 1/2014 | Yang et al. |
| 2014/0070312 A1 | 3/2014 | Yang et al. |

* cited by examiner

SEMICONDUCTOR DEVICE WITH NON-ISOLATED POWER TRANSISTOR WITH INTEGRATED DIODE PROTECTION

FIELD OF THE INVENTION

Embodiments of the present invention relate generally to semiconductor devices, and more particularly to non-isolated power transistors.

BACKGROUND OF THE INVENTION

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power and high-voltage transistor devices are designed to be tolerant of the high currents and voltages that are present in power applications such as motion control, air bag deployment, and automotive fuel injector drivers. One type of MOS transistor used in power applications is a laterally diffused metal-oxide-semiconductor (LDMOS) transistor. In an LDMOS device, a drift space is provided between the channel region and the drain region.

LDMOS devices may be designed to operate in a high-side configuration in which all of the device terminals are level shifted with respect to the substrate potential. Devices configured for high-side operation have been applied in power switchers in DC-to-DC converters, which have respective LDMOS devices for the high side and low side. High-side capable devices may be designed to prevent a direct punch-through path from a body region of the LDMOS device to an underlying substrate.

LDMOS devices are often used in applications, such as automotive applications, involving operational voltages greater than 45 Volts. Breakdown resulting from applying such high voltages to the drain is often prevented through a reduced surface field (RESURF) structure in the LDMOS device design. The RESURF structure is designed to deplete the drift space of the LDMOS device in both vertical and lateral directions, thereby reducing the electric field near the surface at the drift region and thus raising the off-state breakdown voltage (BVdss) of the device.

Breakdown events may nonetheless occur at an intrinsic location along the on-state current conduction path between the drain and source of an LDMOS device. Such intrinsic breakdown events, for example, ESD stress, often lead to device degradation and even complete failure of the device. One technique for avoiding intrinsic breakdown involves use of a second device in parallel with the LDMOS device to clamp the drain voltage to a level between the expected operating voltage of the LDMOS device and the intrinsic breakdown voltage of the LDMOS device. Clamping is especially effective if it simultaneously diverts current from the intrinsic device. However, the use of a second device undesirably leads to additional fabrication costs.

In some applications, a lateral clamp diode is used in the end termination regions of the transistor. However, the diode does not scale with transistor width, and photo misalignments in its fabrication affect the breakdown voltage. In other applications, a body contact in the termination regions of an LDMOS device has been modified by placing a vertical clamp diode within the contact. However, the cathode of the clamp diode is fabricated using N+ material and, therefore, its breakdown voltage and utility are thus limited. In addition, without adding cost and complexity to the process flow to introduce an N+ region which is not similar to the existing N+ Source/Drain region, little adjustment can be made to the clamp voltage in such a set-up.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

DETAILED DESCRIPTION

Figure 1:
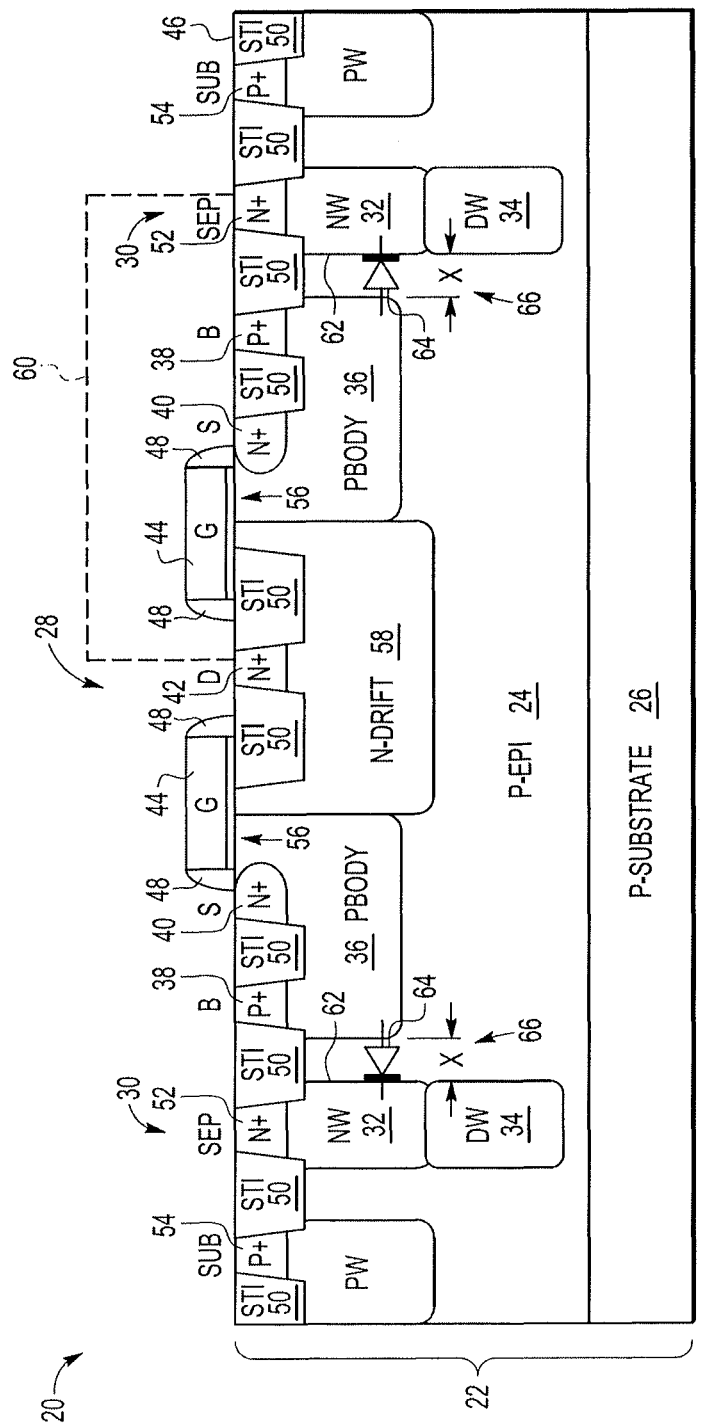
FIGS. 1-2 are cross-sectional, schematic, elevational views of embodiments of n-channel LDMOS transistors with integrated breakdown protection diodes according to embodiments of the invention.

Embodiments of the invention generally include power and high-voltage transistor devices such as LDMOS devices configured with one or more integrated internal lateral and vertical junction breakdown protection diodes spaced apart from the channel region of a transistor, electronic apparatus that incorporate the devices, and methods for forming the devices.

The breakdown protection diode can include or correspond with a junction having a breakdown voltage configured to protect a channel or other conduction region or path of the power transistor device. The protection diode can be electrically tied or clamped to the power transistor device (e.g., in a parallel configuration) to be subject to the same voltage being the voltage applied to the terminals of the power transistor device. The junction of the breakdown protection diode is configured to breakdown at a voltage level lower than a breakdown voltage of the power transistor device near the conduction path (e.g., the channel). Breakdown protection of the power transistor device is provided by relocating the site of a breakdown event rather than by attempting to prevent a breakdown from occurring altogether. The relocation shifts the breakdown site from the normal on-state conduction path to the location of the diode or junction.

The protection diode or junction is not located in a normal conduction path of the device. In embodiments, the protection diode or junction is spaced from the normal conduction path. Consequently, a breakdown event (e.g., an electrostatic discharge (ESD) event) occurring at such a diode or junction is non-destructive to normal device operation.

The protection diode or junction can be integrated internally into an active area of the power transistor device. As such, the protection diode or junction is not positioned in an end termination region of the device. By integrating the protective diode or junction internal to the device, the size of the diode or junction can be scaled with the size of the device (e.g., transistor width), so as to provide a level of protection appropriate to that transistor size. In addition, by internally integrating the protective diode or junction, the overall size (i.e., footprint) of the device can be maintained and does not necessarily need to be increased compared to the device without the protective diode or junction.

Although described below in connection with n-channel LDMOS transistors, application of the features of the disclosed transistor devices is not limited to LDMOS or other power MOS devices, or to any particular transistor configuration. One or more features of the disclosed transistor devices can be applied to other device configurations (e.g., self-aligned MOS transistors). For example, the internally integrated protection diodes of the disclosed transistor devices can be used in a wide variety of power electronic devices. The composite field drift regions are also not limited to any one particular type of reduced surface field (RESURF) structure configuration. In embodiments, the transistor devices can include varying RESURF structures, including single, double, or other RESURF structural arrangements, each of which may be referred to herein as a "RESURF transistor."

The breakdown voltage of the protection diode or junction can be configured (or tuned) for a variety of applications. For example, the breakdown voltage of the diode or junction can be established at a level between and spaced from the operating voltage of the transistor device and the breakdown voltage at or near the channel region and/or drain region (BVdss) of the device.

For convenience of description and without any intended limitation, n-channel LDMOS devices are described and illustrated herein. The disclosed devices are not limited to n-channel devices, as p-channel and other types of devices can be provided, for example, by appropriate substitution of semiconductor regions of opposite conductivity type. Thus, in embodiments, each semiconductor region, layer or other structure described below can have a conductivity type (e.g., n-type or p-type) opposite to the type identified.

FIG. 1 illustrates a schematic cross-sectional view of an embodiment of an n-channel field drift LDMOS transistor device 20 according to embodiments of the present invention. In embodiments, the LDMOS transistor device 20 can be configured as a RESURF transistor. The transistor device 20 includes a semiconductor substrate 22, which can include one or more epitaxial layers 24. As illustrated, in embodiments, the semiconductor substrate 22 includes a single p-type epitaxial (p-epi) layer that is grown on an initial, or original, substrate 26 (e.g., a heavily doped p-type substrate). The transistor device 20 can alternatively or additionally include non-epitaxial layers in which one or more device regions are formed. One or more layers of the semiconductor substrate 22 can include silicon. The structural, material, and other characteristics of the semiconductor substrate 22 can vary from the embodiment shown. For example, the semiconductor substrate can include a silicon-on-insulator (SOI) construction. The semiconductor substrate 22 can be composed of additional, fewer, or alternative semiconductor and/or non-semiconductor layers than illustrated. The substrate 22 can be a bulk silicon substrate, a substrate that includes epitaxially grown layers, or other type of semiconductor substrate.

An active area 28 of the transistor device 20 is defined by one or more separation layers or regions in the semiconductor substrate 22 (e.g., the epitaxial layer 24). Transistor devices according to embodiments of the present invention are considered to be non-isolated structures in that the active area 28 of the device is not bounded by a buried layer (e.g., an N-type buried layer or NBL) or other well or region which extends across (e.g., under) the active area 28 of the device 20 to electrically isolate or separate the active area 28 from other regions of the substrate 22 and/or the initial P-type substrate 26. In embodiments, the active area 28 is laterally surrounded by one or more separation layers or regions as a barrier to separate the active area 28 along its periphery from a portion of the substrate 22.

As illustrated in FIG. 1, the active area 28 can be bounded by a separating region 30 situated outside of, or along, the periphery of the active area 28. In embodiments, the separating region 30 can have a ring-shaped configuration to surround the active area 28. Formation of the separation region 30 can be performed in conjunction with the formation of one or more n-type wells of the transistor device, such as an n-type drift (N-DRIFT) region. In the illustrated example, the separating region 30 is composed of a doped n-type separation well (NW) 32. Additional separation regions can be formed in the semiconductor substrate 22, with any region being connected to another region.

In embodiments, the separating region 30 is a composite region of a plurality of contiguous, constituent separation regions. For example, as shown, the separating region 30 can include a doped n-type separation well (NW) 32 and a contiguous deep well region (DW) 34. In embodiments, the separation well (NW) 32 and/or the deep well region (DW) 34 can be in a ring-shaped configuration around the active area 28. In other embodiments, the separating region can be formed solely as the n-type separation well (NW) 32 (without the deep well DW 34), or as the n-type separation well (NW) 32 and deep well region (DW) 34 formed as a single unit by a single implant.

The transistor device 20 includes a body region (PBODY) 36 in the semiconductor substrate 22. In the illustrated embodiment, the body region (PBODY) 36 is formed as a p-type well in the epitaxial layer 24 of the substrate 22. The body region (PBODY) 36 is biased via one or more heavily doped p-type body contact regions or electrodes (P+) 38 formed in or above the p-type well of the body region (PBODY) 36 in the semiconductor substrate 22. The dopant concentration of each contact region 38 can be at a level sufficient to establish an ohmic contact to the body region (PBODY) 36.

The transistor device 20 includes heavily doped source (S) regions 40 and drain (D) region 42 in the semiconductor substrate 22. Any number of source or drain regions can be provided. In this embodiment, the source regions (S) 40 and drain region (D) 42 are n-type doped portions of the epitaxial layer 24. The heavily doped n-type source region (S) 40 is positioned within the body region (PBODY) 36. The heavily n-type doped drain region (D) 42 is spaced from the body region (PBODY) 36 to define a conduction path of the transistor device between the source region (S) 40 and the drain region (D) 42. The source and drain regions, or a portion thereof, can have a dopant concentration at a level sufficient to establish ohmic contacts for biasing the source and the drain region. In a typical LDMOS configuration, the drain region (D) 42 is biased at a high voltage, Vds, relative to the source region (S) 40, which can, for example, be considered to be at low or ground potential.

The transistor device 20 further includes one or more gate structures (G) 44 formed on or above a surface 46 of the semiconductor substrate 22. In the embodiment shown in FIG. 1, the transistor includes a dual gate finger structure composed of a pair of gate structures (G) 44 each of which is positioned between the source regions (S) 40 and the drain region (D) 42. Any number of gate fingers can be used. Each gate structure 44 includes a conductive gate situated on or above a gate dielectric (not shown), which insulates the conductive gate from the substrate 22. By example, the gate dielectric can be composed of silicon dioxide (or oxide) deposited or otherwise formed on the surface 46 of the semiconductor substrate 22. Dielectric sidewall spacers 48 along the lateral edges of the gate structure 44 separate the conductive components of the gate structures from the source region (S) 40 and other regions of the active region 28. In embodiments, a sidewall spacer 48 can be used for alignment purposes during formation of the source region (S) 40 to define an edge of the source region.

As shown in FIG. 1, shallow trench isolation (STI) regions 50 can be formed at the surface 46 in the semiconductor substrate 22. As illustrated, the gate structures (G) 44 are separated from the drain region (D) 42 by STI regions 50. The STI regions 50 under the gate structures (G) 44 help sustain a high breakdown voltage BVdss for the LDMOS (e.g., field-drift or trench-drift LDMOS). The STI trench regions 50 facilitate depletion of the N-drift region 58 to allow for the presence of a higher potential in the N-drift region 58.

Other STI regions 50 can be situated in the semiconductor substrate 22 to isolate or separate various contact regions, such as the body contact region (B) 38 and the source region (S) 40, as well as other regions for biasing components of the device 20. For example, a separation contact region or electrode (SEP) 52 and a substrate contact region (SUB) 54 can be separated by a STI region 50.

When the gate structure 44 is biased, charge carriers (e.g., electrons or, alternatively, holes) accumulate in one or more channel regions 56. Each channel region 56 or a portion thereof can be located in the body region (PBODY) 36 under the gate structure 44. In embodiments, the accumulation of electrons results in a charge inversion in the channel region 56 from the p-type body region (PBODY) 36 to an n-type conduction area near the surface 46 of the semiconductor substrate 22. Once a sufficient amount of the charge carriers accumulate in the conduction area, charge carriers can flow from the source region (S) 40 through the channel region 56 and toward the drain region (D) 42.

The channel region 56 can include other regions or areas in the semiconductor substrate 22 in which charge inversion or accumulation occurs as a result of the bias applied to the gate structure 44. Charge carriers can also accumulate at the surface 46 of the substrate 22 outside of or beyond the body region (PBODY) 36. For example, charge carriers can accumulate in an area near the surface 46 of the semiconductor substrate 22 in the n-type region situated under the gate structures (G) 44. In embodiments, this area can be considered to be part of an accumulation region of the transistor device 20. The channel region 56 and the accumulation region can form part of a conduction path of the transistor device 20.

The conduction path of the device 20 is not limited to regions in which charge inversion occurs or to regions in which conduction is enabled or enhanced via the bias voltage applied to the gate structure 44. The conduction path of the device 20 is thus not limited to regions at or near the surface 46 of the semiconductor substrate 22. For example, the conduction path can include a portion of a field drift region of an LDMOS device through which charge carriers drift to reach the drain region (D) 42. As such, the conduction path of the transistor device 20 can include regions having a different conductivity type than the body region (PBODY) 36. In embodiments, the conduction path can include an n-type region, such as an n-type field drift (N-DRIFT) region, or a layer or area thereof.

The conduction path of the transistor device 20 can include additional regions, which can be n-type or p-type, at or near the surface 46 of the semiconductor substrate 22. The transistor device 20 is configured to prevent a breakdown event from occurring at, near, or along the conduction path. Preventing breakdown in these and other conduction regions of the transistor device 20 can avoid damage to the device from a breakdown event.

The path along which the charge carriers flow from the source region (S) 40 to the drain region (D) 42 passes through a drift (e.g., N-DRIFT) region 58 in the semiconductor substrate 22. The drift region (N-DRIFT) 58 can be configured to allow the charge carriers to drift under the electric field established by the drain-source voltage applied between the drain region (D) 42 and the source region (S) 40. In the embodiment in FIG. 1, the drift region (N-DRIFT) 58 is composed of an n-type well. The drain region (D) 42 is formed on or otherwise above the drift region (N-DRIFT) 58. A junction forms between the n-type well drift area 58 and the p-type epitaxial layer (P-EPI) 24 to establish a RESURF effect directed to decreasing the electric field in areas in and/or around the drift region (N-DRIFT) 58 to increase the intrinsic breakdown voltage (BVdss). One or more additional regions can be incorporated into, or adjacent to, the drift region (N-DRIFT) 58 to further reduce the electric field along or near the STI regions 50 such that HCI effects and/or breakdown therein is avoided. The location of the STI region 50 defines portions of the conduction path of the transistor device 20 between the source region (S) 40 and drain region (D) 42. This portion of the conduction path of the device 20 is within the drift region (N-DRIFT) 58 and outside of the channel region 56. Breakdown events along this portion of the conduction path are also prevented.

The drain region (D) 42 is electrically tied or coupled to the separating regions 30, as shown schematically by the dashed line 60 in FIG. 1. The coupling of the drain region (D) 42 to the separating regions 30 can include a metal line 60. The drain bias voltage can be applied to the separating regions 30 of the device 20 via the separation contact region or electrode (SEP) 52 for the separation well (NW) 32. In the embodiment illustrated in FIG. 1, the separation well (NW) 32 is connected to a deep well (DW) 34 such that the deep well (DW) 34 is also biased at the drain operational voltage. The separating regions are thus biased relative to the semiconductor substrate 22 via the drain operational voltage and the voltage applied to the semiconductor substrate at the substrate contact region (SUB) 54.

The biasing of the separating regions also defines reverse-biased junctions between the separating regions and the body region (PBODY) 36. With the drain region (D) 42 tied to the separating regions, junctions involving any of the separating regions experiences the same voltage applied to the drain region (D) 42. The drain voltage can therefore be clamped (e.g., in a parallel configuration) to the voltage across such junctions.

In the embodiment depicted in FIG. 1, an LDMOS power transistor device 20 is separated via a ring-shaped separation well (NW) 32 and a deep well region (DW) 34, each of which can be electrically shorted with a drain region (D) 42. In the illustrated embodiment, the separation well (NW) 32 and deep well (DW) region 34 are ring-shaped to surround the active area 28 of the transistor device 20. The transistor device 20 is configured with an integrated breakdown protection diode 64 that is oriented laterally within the transistor device 20. The protection diode 64 is defined between the separation well (NW) 32 and a body region (PBODY) 36. In this embodiment, a junction involving the separation well (NW) 32 is lateral. The lateral junction of the protection diode 64 is formed along an interface 62 between the separation well (NW) 32 and the p-type epitaxial layer (P-EPI) 24. The reverse-biased junction is situated between the separation region and the p-type epitaxial layer (P-EPI) 24. The body region (PBODY) 36 is at the same potential as the p-type epitaxial layer (P-EPI) 24 and its distance from the actual junction between the separation region and P-EPI influences the breakdown of the separation region to P-EPI junction, as long as the body region (PBODY) 36 is situated close enough to that junction. This distance is used to set the value of the breakdown. The exact variation depends on the doping of the separation region, p-type epitaxial layer (P-EPI) 24 and body region (PBODY) 36, and the curvature of the dopant profiles.

With the separation well (NW) 32 tied to the drain region (D) 42, the junction is reverse biased relative to the body region (PBODY) 36. The interface 62 (and/or the regions defining the interface 62) is configured such that the junction experiences breakdown before the conduction regions of the transistor device 20. The breakdown voltage of the junction at the interface 62 is thus set to a level higher than the drain-source (D-S) operational voltage (e.g., 80 Volts) but lower than the breakdown voltage of the transistor device 20 in the conduction path (e.g., 95 Volts), which can be referred to as the "intrinsic breakdown voltage level" of the transistor device 20. The breakdown voltage at the interface 62 (or other interface involving the separating regions of the transistor device 20) can be referred to as an "extrinsic breakdown voltage level" of the transistor device 20.

FIG. 1 includes a symbolic depiction of the integrated breakdown protection diode 64. The symbolic depiction of a protection diode in any of the drawing figures is accordingly not intended to denote any additional semiconductor region, arrangement, or configuration beyond or in addition to the depicted semiconductor structures and/or regions. With the junction interface 62 oriented vertically, the integrated breakdown protection diode 64 is oriented laterally as shown. The terminals of the protection diode 64 are connected in parallel with the terminals of the body region (PBODY) 36 and drain region (D) 42 of the transistor device 20 to provide the breakdown protection. The device 20 can include any number of such breakdown protection diodes 64.

The extrinsic breakdown voltage level can be set to an appropriate level by a modification of the separation region (e.g., separation well (NW) 32) and/or the body region (PBODY) 36. The modification can involve, for example, a variation or adjustment in dopant concentration level, a variation in the shape or size of a separation region and/or the body region (PBODY) 36, and/or a variation of the separation between a separation region and the body region (PBODY) 36 or, in another embodiment, between a deep well and the body region (PBODY).

In the embodiment depicted in FIG. 1, the separation well (NW) 32 and the deep well region (DW) 34 are spaced from a device body region (PBODY) 36. These regions of the device 20 are formed in a p-type epitaxial region (P-EPI) 24 of a substrate 22. A portion 66 of the epitaxial region 24 is situated between the body region (PBODY) 36 and the ring-shaped separation well (NW) 32. By adjusting the width, X, of the portion 66 of the epitaxial region (P-EPI) 24, the separation well (NW) 32 and the body region (PBODY) 36 can be spaced apart to an extent that establishes the extrinsic breakdown voltage for the junction at the interface 62 lower than a breakdown voltage between, for example, the drain region (D) 42 and the body region (PBODY) 36 in the conduction path of the device 20.

The breakdown voltage of the protection diode 64 can be set to a level between the intrinsic breakdown voltage of the transistor device 20 (e.g., BVdss) and the operational voltage (Vop) of the transistor device 20. The width (X) can be adjusted by modifying the lateral extent of the ring-shaped separation well (NW) 32 and/or the lateral extent of the body region (PBODY) 36. The portion 66 of the epitaxial region (P-EPI) 24 and, thus, the diode 64, is not in the normal conduction path of the transistor device 20. Therefore, any eventual breakdown is non-destructive to normal operation of the transistor device 20. In embodiments, the width, X, can be about 0.01 to 10 μm, or about 1 to 2 μm. The width, X, can be varied based, for example, on the desired breakdown voltage and dopant level concentrations of the body region (PBODY) 36, the separation well (NW) 32, and/or the epitaxial region (P-EPI) 24. In the illustrated embodiment, the body region (PBODY) 36 has a substantially constant (uniform) dopant concentration over a large extent in the lateral direction but a non-constant (non-uniform) dopant concentration in the vertical direction. The separation well (NW) 32 and the body region (PBODY) 36 can thus define a diode depletion region having the desired breakdown voltage. The integrated location of the breakdown protection diode 64 allows the protection diode 64 to scale with the width of the LDMOS device 20.

The transistor device 20 is shown in simplified form and, thus, FIG. 1 does not show the conductive (e.g., ohmic) contacts and other metal layers configured for electric coupling with the source regions (S) 40, the drain regions (D) 42, and the gate structures (G) 44. The transistor device 20 can have a number of other structures or components for connectivity, isolation, passivation, and other purposes, which are not shown in FIG. 1 for ease in illustration. For example, the transistor device 20 can include additional separating regions or layers. Additional STI regions, isolation trenches, and/or separation wells (not shown) can be provided to separate the active area 28 and/or other region of the transistor device 20.

Figure 2:
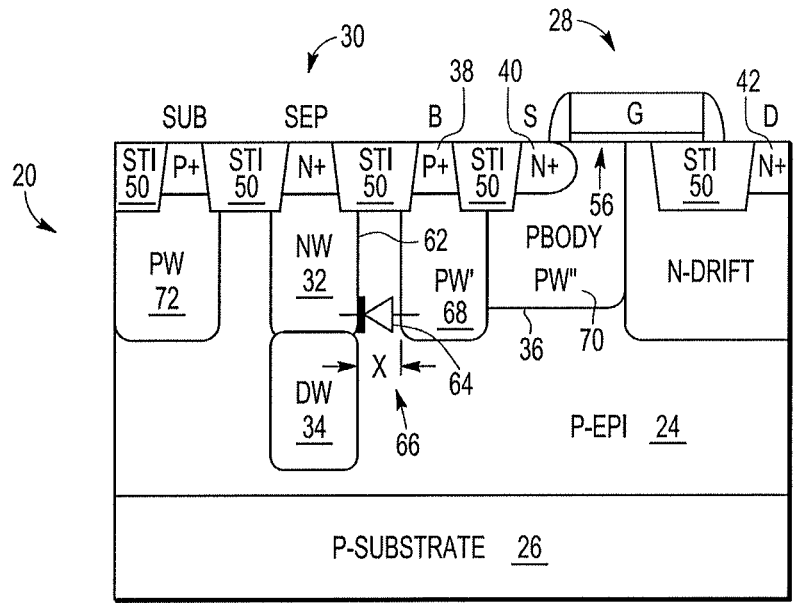

FIG. 2 illustrates another embodiment of a transistor device 20 configured with a laterally oriented breakdown protection diode 64. The transistor device 20 depicted in FIG. 2 is an embodiment in which a body region (PBODY) 36 is also modified to set the extrinsic breakdown voltage level via a modification of the p-type body regions (PBODY) 36 of the transistor device 20. The modification can involve, for example, a variation or adjustment in dopant concentration level and/or variation in the shape or size of a separation region and/or the body region (PBODY) 36. In the illustrated embodiment, the body region (PBODY) 36 is a non-uniform or composite region including multiple wells, including an outer well and an inner well. As depicted, the body region 36 can be configured with an outer well (PW') 68 and an inner well (PW") 70 adjacent to the outer well (PW') 68.

The breakdown voltage of the protection diodes 64 can be set through adjustments to pre-existing fabrication procedures used in the formation of regions in other devices (e.g., logic transistors). The flexibility provided by adjusting procedures for fabricating the body region (PBODY) 36 and/or the separating regions, can be useful to achieve, for example, a desired spacing between the regions defining the protection diode 64 (e.g., the separation well (NW) 32 and the outer well (PW') 68 of the body region (PBODY) 136). Such flexibility can be useful where a desired spacing cannot be easily achieved by an adjustment to only one of the regions. Adverse effects on the other devices (e.g., logic transistors) formed by the procedure can thus be avoided.

The outer well (PW') 68 can be situated laterally outward of the inner well (PW'') 70, or positioned closer to the periphery of the active area 28. The source region (S) 40 is situated on or otherwise above the inner well (PW'') 70. Additional or alternative wells or regions may be provided in the body region (PBODY) 36.

In an embodiment, the outer side of the body region 36 can be doped to form the outer well (PW') 68, for example, using a low voltage p-type well implantation procedure in connection with the formation of a p-type region of a logic device (e.g., CMOS) formed in the semiconductor substrate 22 and/or in connection with the formation of one or more p-type wells (PW) 72 in the semiconductor substrate 22 outside of the active area 28 of the transistor device 20. An additional implant procedure can be implemented to form the outer well (PW') 68. In the illustrated embodiment, the outer well (PW') 68 has a depth in common with the well (PW) 72 as shown in FIG. 2. In embodiments, the wells (PW) 72 are directed to biasing the original substrate 26. For ease in illustration, the depicted well (PW) 72 is intended to, alternatively or additionally, schematically indicate the p-type region of the logic transistor or other device (e.g., CMOS device) also formed in the semiconductor substrate 22. The logic device and the transistor device 20 can form parts of one or more electronic circuits having any number of logic and power devices arranged in an electronic apparatus.

In the embodiment illustrated in FIG. 2, each body region (PBODY) 36 includes a p-type well (PW') 68 spaced from the separation well (NW) 32 to an extent that establishes a breakdown voltage for the junction at the interface 62 between the separation well (NW) 32 and the body region (PBODY) 36 lower than a breakdown voltage between, for example, the drain region 42 and the body region (PBODY) 36 or the drain region 42 and the source region (S) 40 in the conduction path of the transistor device 20. By an example, the spacing between the outer well (PW') 68 and the separation well region (NW) 32 can be about 0.01-10 μm, or about 1-2 μm. The spacing can vary for example, based on one or more of the dopant concentration levels of the outer well (PW') 68, the separation well region (NW) 32, and the epitaxial layer 24. The outer well (PW') 68 and the separation well region (NW) 32 can thus define a diode depletion region having the desired breakdown voltage. The positioning of the outer well (PW') 68 can ensure that the lateral breakdown protection diode 64 is not in the normal current conduction path of the transistor device 20.

The implantation procedure can be configured to establish the depth and/or dopant concentration of the outer well (PW') 68 to establish the extrinsic breakdown voltage at a level between the intrinsic breakdown voltage (e.g., BVdss) and the operational voltage of the transistor device 20. In this embodiment, the outer well (PW') 68 is illustrated with a greater depth than the inner well (PW'') 70. The greater depth of the outer well (PW') 68 can reduce the diode series resistance and/or provide better control of the breakdown voltage of the protection diode 64. A deeper outer well potentially has the benefit of pushing the breakdown location deeper and further away from the trench bottom (STI) so as to minimize charge trapping in the STI oxide and obtain more stable and better controlled breakdown voltage. The deeper well (PW'') will typically have lower dopant concentration as a function of depth and a more rounded junction, allowing it to be used for higher breakdown voltages. In addition, a deeper junction will typically have less manufacturing variation, allowing better production control.

The outer well (PW') 68 can also have a different dopant concentration level than the inner well (PW'') 70. As a result of the different depths and/or non-uniform dopant concentration levels, the breakdown voltage of the junction can be tuned or adjusted, to protect the channel or conduction path of the transistor device 20. With the presence of the outer well (PW') 68, the inner well (PW'') 70 can be optimized to obtain the desirable transistor performance while the outer well (PW') 68 can be tuned or adjusted to achieve the best protection for the transistor. In a process flow where there are more than one existing p-type wells available, the outer well (PW') 68 and the inner well (PW'') 70 may be formed using different existing p-type well process without adding dedicated process steps.

The outer well (PW') 68 and other components of the protection diode 64 are spaced from the source region (S) 40 and channel region 56 by the remainder of the body region (PBODY) 36 (e.g., the inner well (PW'') 70). Each outer well (PW') 68 is thus separated or spaced from the conduction regions of the transistor device 20. The separation or spacing is sufficient to avoid damage to the conduction regions in the event of a breakdown at the junction 62. In this embodiment, each p-type outer well (PW') 68 is positioned under the body contact region (B) 38 laterally outward of such conduction regions of the transistor device 20 and adjacent the separating regions of the device 20, such as the ring-shaped separation well (NW) 32 and/or the deep well region (DW) 34.

The nature of the modifications to, or non-uniformity of, the body region (PBODY) 36 can vary from the embodiment shown in FIG. 2. Alternatively or additionally, other regions of the transistor device 20 can be configured to be non-uniform to establish a desired breakdown voltage level. For example, the breakdown protection diode can be vertically or diagonally oriented with regard to a separating region, such as the ring-shaped separation well (NW) 32 or other region surrounding the active area 28 and spaced from the body region (PBODY) 36. Details regarding these and other embodiments are provided below. Any combination of the modifications can be incorporated into alternative embodiments.

Figure 3:
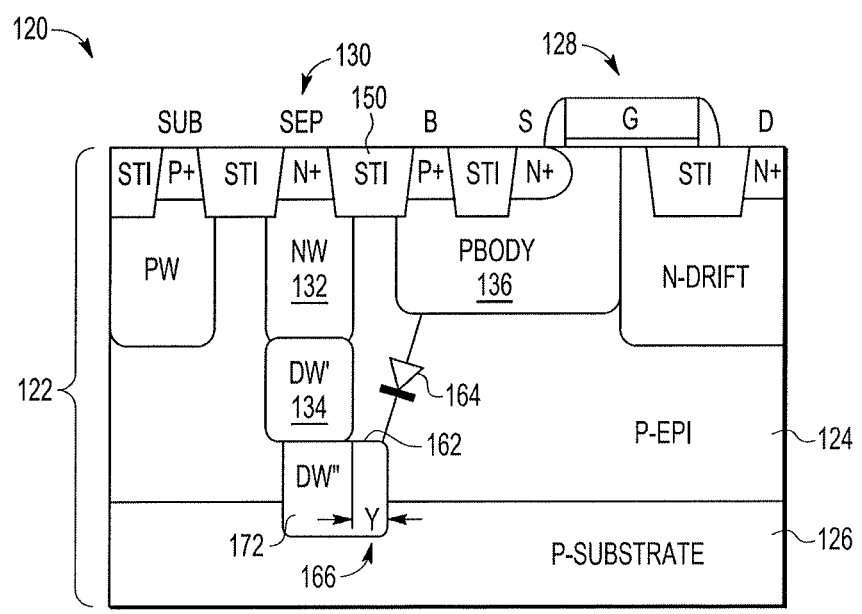
FIGS. 3-4 are cross-sectional, schematic, elevational views of further embodiments of n-channel LDMOS transistors with integrated breakdown protection diodes according to embodiments of the present invention.
Figure 4:
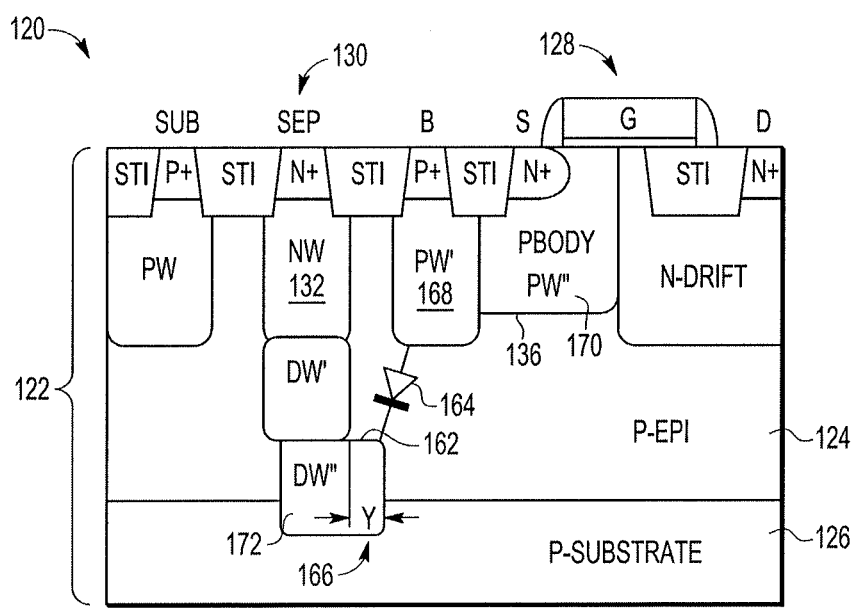

FIGS. 3-4 depict additional transistor devices according to embodiments of the present invention, each having a breakdown protection diode or junction. In each embodiment, one or both of the regions defining the diode or junction are configured to establish a breakdown voltage level to protect the conductive regions of the transistor device. The configuration of such region(s) can utilize a pre-existing step or procedure (e.g., a dopant implant) in a fabrication process designed for forming doped areas within the device. The different embodiments utilize different pre-existing steps or procedures of a fabrication process. In embodiments, the breakdown protection diodes achieved by the transistor devices according to embodiments of the present invention can be formed by a variety of fabrication processes (or process technologies) without requiring any additional implants or other procedures other than the set steps of an established fabrication procedure for the transistor device.

FIG. 3 depicts another embodiment of an LDMOS device 120 in which a protection diode 164 is defined between a body region (PBODY) 136 and a deep well (DW'') region 172. As shown, the protection diode 164 is oriented on a diagonal line in this embodiment. As shown, the body region (PBODY) 136 is not formed above the deep well region (DW") 172, and no portion of the deep well region (DW") 172 overlaps or extends under the body region (PBODY) 136. In embodiments, there can be some overlap between the deep well region (DW") 172 and the body region (PBODY) 136, making the diode vertical. The body region (PBODY) 136 is laterally spaced from the deep well region (DW") 172. The width of the deep well region (DW") 172 exceeds the width of a ring-shaped separation well region 132 by an extension distance "Y". In embodiments, the distance Y can be about 0.2-2 µm, or about 1 µm. In the illustrated embodiment, a p-type epitaxial region (P-EPI) 124 in which these regions are formed is situated between the body region (PBODY) 136 and the deep well region (DW") 172 to establish a desired breakdown voltage level. The distance between the deep well region (DW") 172 and the body region (PBODY) 136 can be adjusted to obtain a desired diode breakdown voltage. By adjusting the extension distance Y of the deep well region (DW") 172 relative to the ring-shaped separation well region (NW) 132, the location of the breakdown can be established along the diagonal direction between the deep well region (DW") and the body region (PBODY) 136. The location of the breakdown can be lower than the breakdown location in the embodiment of FIG. 1. Thus, the breakdown can occur at a greater depth below an STI region or oxide trench 150. Charge trapping in the trench oxide (STI) can thus be avoided during a breakdown event.

In the embodiment depicted in FIG. 4, the LDMOS transistor device 120 also has a diagonally oriented protection diode 164 defined between the body region (PBODY) 136 and a deep well (DW") 172, similar to FIG. 3. Unlike that embodiment, the transistor device 120 has a non-uniform body region (PBODY) 136 which includes an outer well region (PW') 168 and an inner well region (PW") 170, similar to the body region (PBODY) 36 described in connection with the embodiment of FIG. 2. The distance or spacing between the outer well region (PW') 168 of the body region (PBODY) 136 and the deep well region (DW") 172 can be adjusted to obtain a desired diode breakdown voltage. As with the embodiment of FIG. 3, by adjusting the inner extension distance Y of the deep well region (DW") 172 relative to the ring-shaped separation well region (NW) 132, the location of the breakdown can be established along the diagonal direction between the deep well region (DW") 172 and the outer well region (PW') 168 of the body region (PBODY) 136.

FIGS. 5 to 12 are directed to embodiments of power transistor devices configured with integrated protection diodes oriented vertically within the transistor device. The junction of the protection diode is lateral. The protection diodes are again defined between a separating region and a body region, but vary by the location of the protection diode and the nature of the separating region and the body region among the embodiments. The power transistor devices of FIGS. 5 to 12 can be otherwise configured in a manner similar to the above-described embodiments.

The embodiments depicted in FIGS. 5 to 8 add a deep well region (DW) 234 and, optionally, a second deep n-type well (DNW) 372, to the separation well (NW) 232, but do not enclose the transistor. This construction distances the n-type areas 234, 372 from the drain region (D) to increase the control of the fields for higher BVDSS. In this construction, the separation regions 234, 372 are shorted to the drain region (D) to provide the desired breakdown protection to the conducting region.

Figure 5:
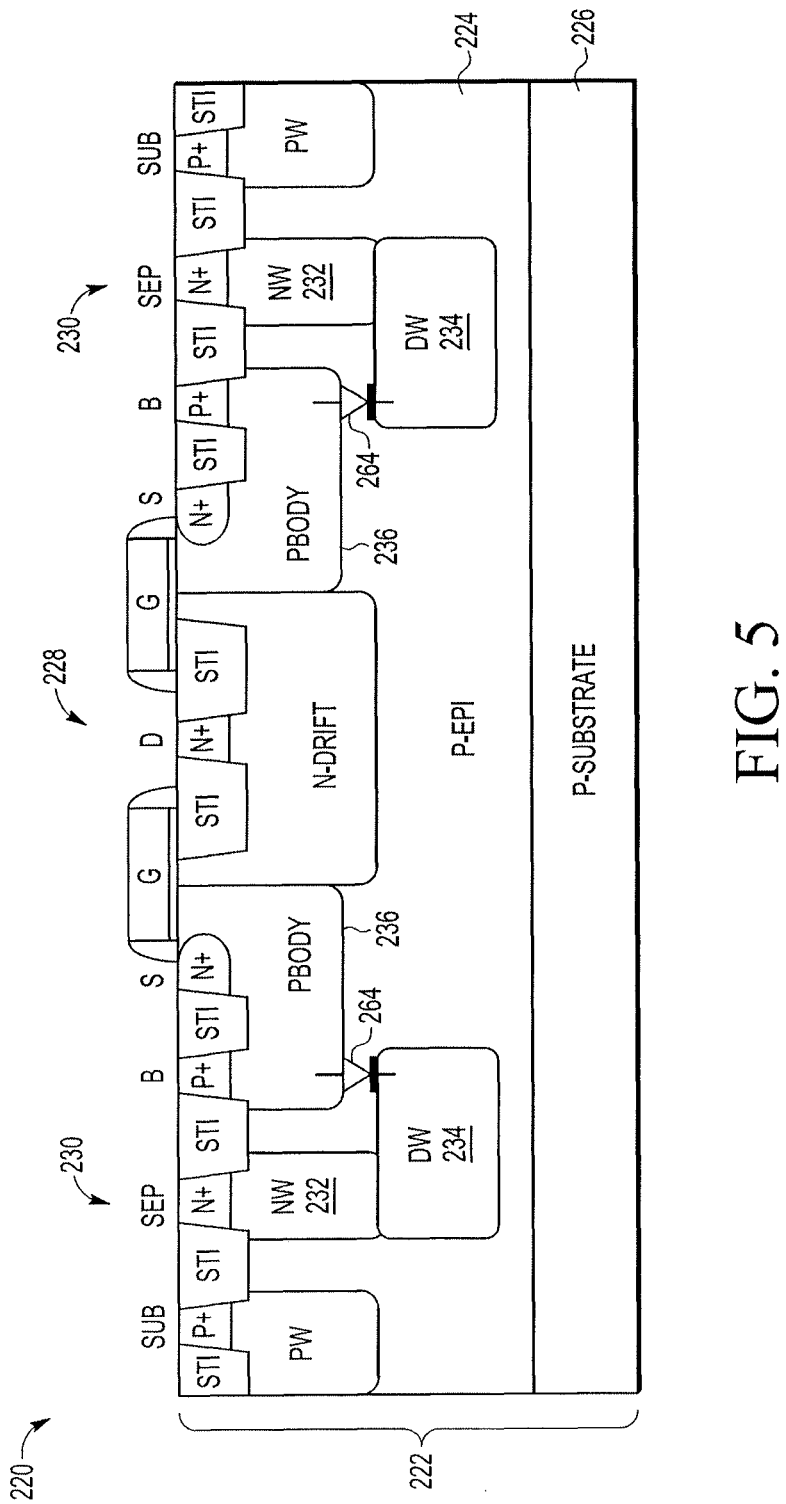
FIGS. 5-12 are cross-sectional, schematic, elevational view of further embodiments of n-channel LDMOS transistors with integrated breakdown protection diodes according to embodiments of the present invention.

FIG. 5 depicts an LDMOS transistor device 220 that includes one or more deep well regions (DW) 234 configured to form one or more vertically oriented protection diodes 264. In embodiments, the deep well region (DW) 234 can be configured as a ring surrounding the active area 228 of the transistor device 220, or as one or more discrete areas coupled to the separation well region (NW) 232. As shown, the deep well region (DW) 234 extends laterally inward beyond the separation well region 232. A body region (PBODY) 236 can be formed above the deep well region (DW) 234. The protective diode 264 is defined where the deep well region (DW) 234 and the body region (PBODY) 236 overlap. The overlap can be configured (e.g., limited) to an outer portion of the body region (PBODY) 236 such that the area in which breakdown occurs is sufficiently spaced from the conduction path of the transistor device 220. The amount of such overlap can vary. The breakdown voltage of the protective diode 264 can be established by adjusting the spacing between the deep well region (DW) 234 and the body region (PBODY) 236. For example, the body region (PBODY) 236 can have a depth to adjust or configure the spacing between the body region (PBODY) 236 and the deep well region (DW) 234. The dopant concentration levels in the deep well region (DW) 234 and the body region (PBODY) 236 can also be configured to establish a desired breakdown voltage of the protective diode 264.

Figure 6:
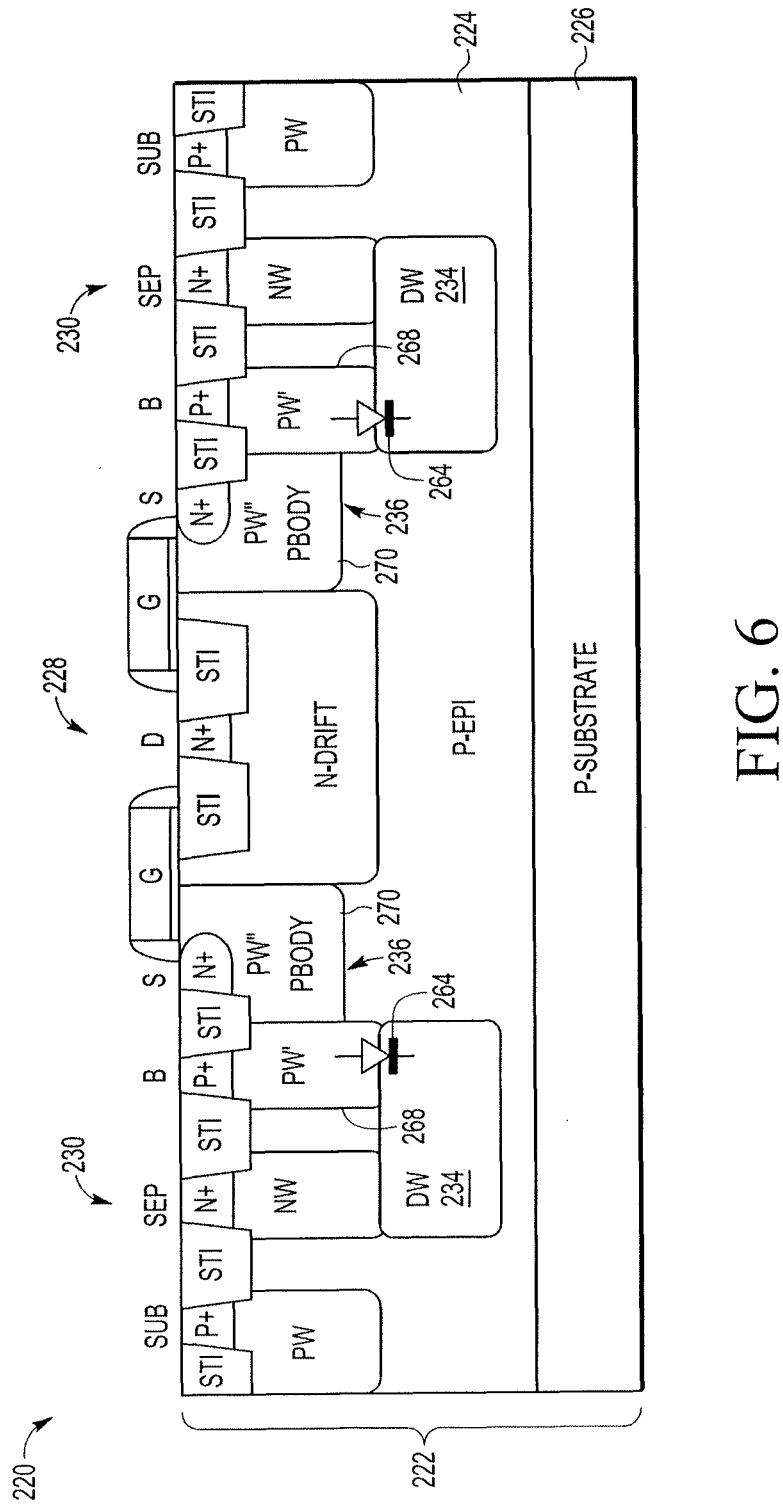

FIG. 6 illustrates a transistor device 220 having one or more vertically oriented protection diodes 264 formed between a body region (PBODY) 236 and one or more laterally extended deep well regions (DW) 234 similar to FIG. 5. This embodiment provides another example of how one or more aspects of the embodiments described herein can be combined to establish a desired breakdown voltage. Unlike the embodiment of FIG. 5, the body region (PBODY) 236 is configured as a non-uniform region which includes an outer well region (PW') 268 and an inner well region (PW") 270, similar to FIGS. 2 and 4. The outer well region (PW') 268 can have a depth to adjust, or configure, the spacing between the outer well region (PW') 268 and the deep well region (DW) 234. Unlike FIG. 5, in this embodiment, the protection diode(s) 264 are formed along a vertical junction defined between the outer well region (PW') 268 and the deep well region (DW) 234. It is not required that the vertical junction extends the entire width of the outer well region (PW') 268, as depicted in FIG. 6. The overlap of the deep well region (DW) 234 and the outer well region (PW') 268 can vary.

Figure 7:
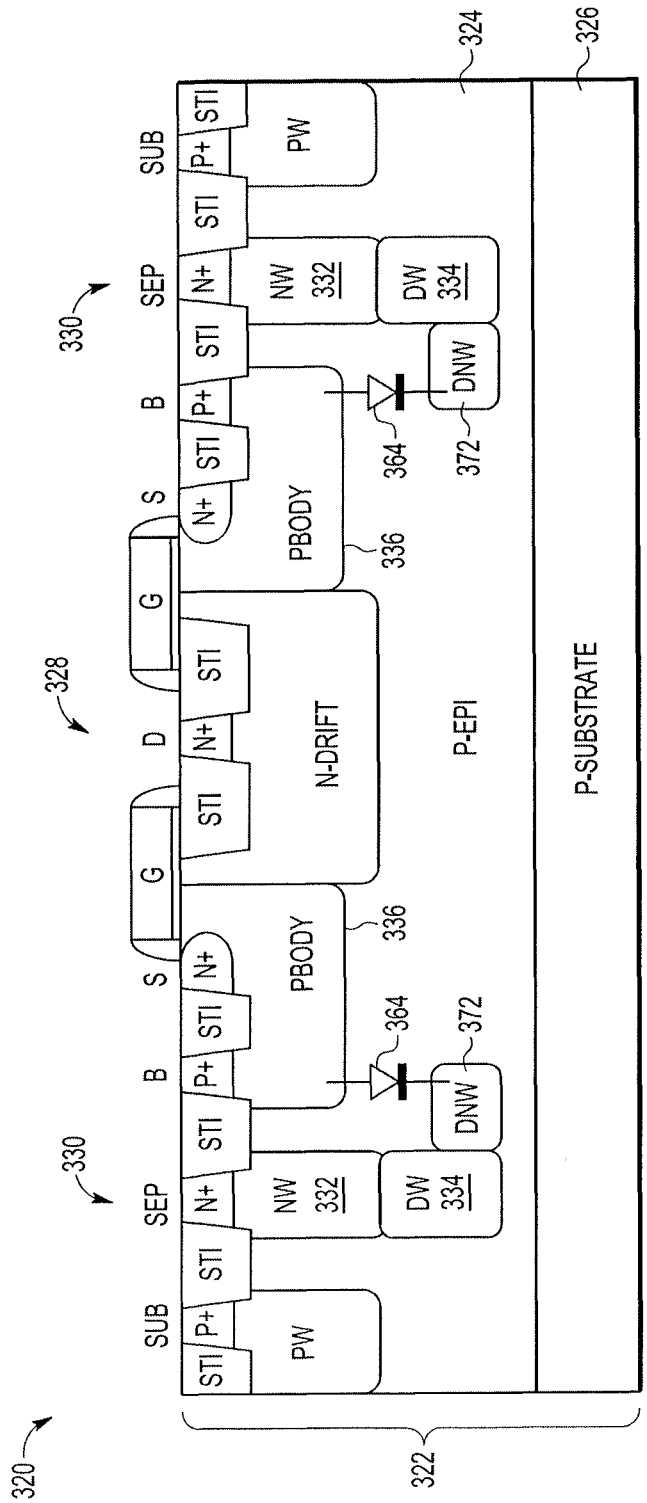

FIG. 7 depicts a transistor device 320 with integrated breakdown protection in conjunction with a non-composite body region (PBODY) 336. Similar to FIG. 1, the body region (PBODY) 336 can be uniform in the lateral direction but can include a non-constant dopant concentration in the vertical direction. As shown, configuration of a vertically oriented protection diode 364 is achieved via an extension of a separating region. In this embodiment, the separating regions of the transistor device 320 include a second deep n-type well (DNW) 372 formed in the semiconductor substrate 322 adjacent one or more of the separating regions. In the illustrated embodiment, the deep n-type well (DNW) 372 is adjacent the deep well region (DW) 334. The deep well region (DW) 334, the deep n-type well (DNW) 372, and the separation well (NW) 332 can be ring-shaped to encircle the active area 328 of the transistor device 320. In some embodiments, the deep n-type well (DNW) 372 is formed during an implant procedure also directed to the formation of a well (not shown) of corresponding depth in connection with a logic transistor or other elements disposed in the semiconductor substrate 322. The depth, dopant concentration level, width, position relative to the body region (PBODY) 336, and other characteristics of the deep n-type well (DNW) 372 can be configured to set the breakdown voltage of the breakdown protection diode 364. For example, a top of the deep n-type well (DNW) 372 can have a depth to adjust a spacing between the deep n-type well (DNW) 372 and the body region (PBODY) 336. In some embodiments, the depth and/or other characteristics of the region (PBODY) 336 can also be adjusted to set the breakdown voltage of the diode 364 at a desired level.

Figure 8:
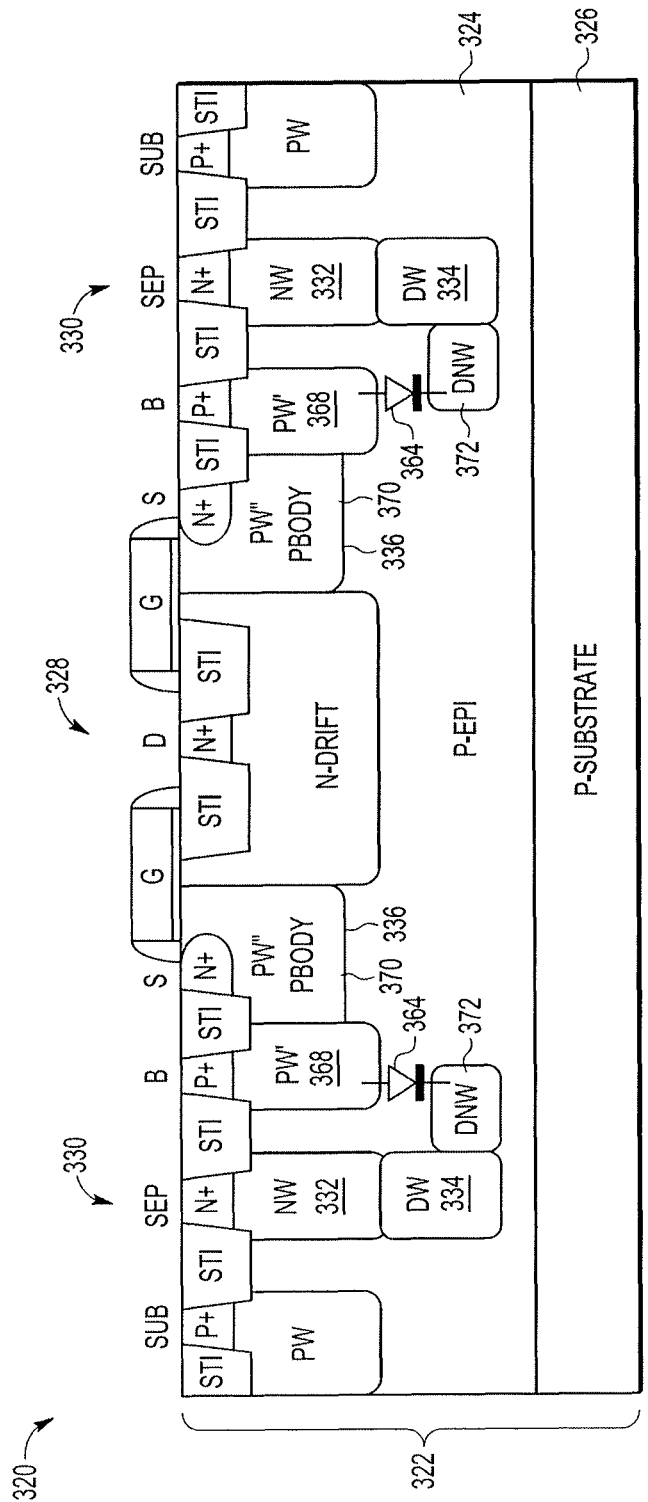

With reference to FIG. 8, transistor device 320 is similar to the device of FIG. 7, with the exception that the body region (PBODY) 336 is also modified to set the extrinsic breakdown voltage level of the protection diode 364. The body region (PBODY) 336 is non-uniform with an outer well region (PW') 368 and an inner well region (PW''') 370, as in the example of FIG. 2. Additional or alternative wells or regions can be provided in the body region (PBODY) 336. As in FIG. 7, one or more vertically-oriented protection diodes 364 with lateral junction(s) with the deep n-type well region (DNW) 372 are defined in the body region (PBODY) 336. In this embodiment, the diode 364 is defined by the outer well region (PW') 368 of the body region (PBODY) 336. The breakdown voltage of the protection diodes 364 can be set, for example, through adjustments to the spacing between the outer well region (PW') 368 and the deep n-type well region (DNW) 372, which spacing defines the protection diode 364.

FIGS. 9 to 12 depict a number of alternative embodiments of the devices disclosed with respect to FIGS. 5 to 8, which are configured with vertically oriented, integrated breakdown protection diodes or junctions. In each embodiment, the separation region of the transistor device 430 is a composite of the separation well region (NW) 432 linked to a heavily doped n-type buried layer (NBL) 474 via a deep well region (DW) 434, and optionally, a deep n-type well region (DNW) 472 (with reference to FIGS. 11-12). The separation regions do not enclose the transistor active area, even if the breakdown is intended to be vertical. This construction allows the intrinsic device breakdown to be maximized without the limitation imposed by the separation region underlying the entire active area 428.

Figure 9:
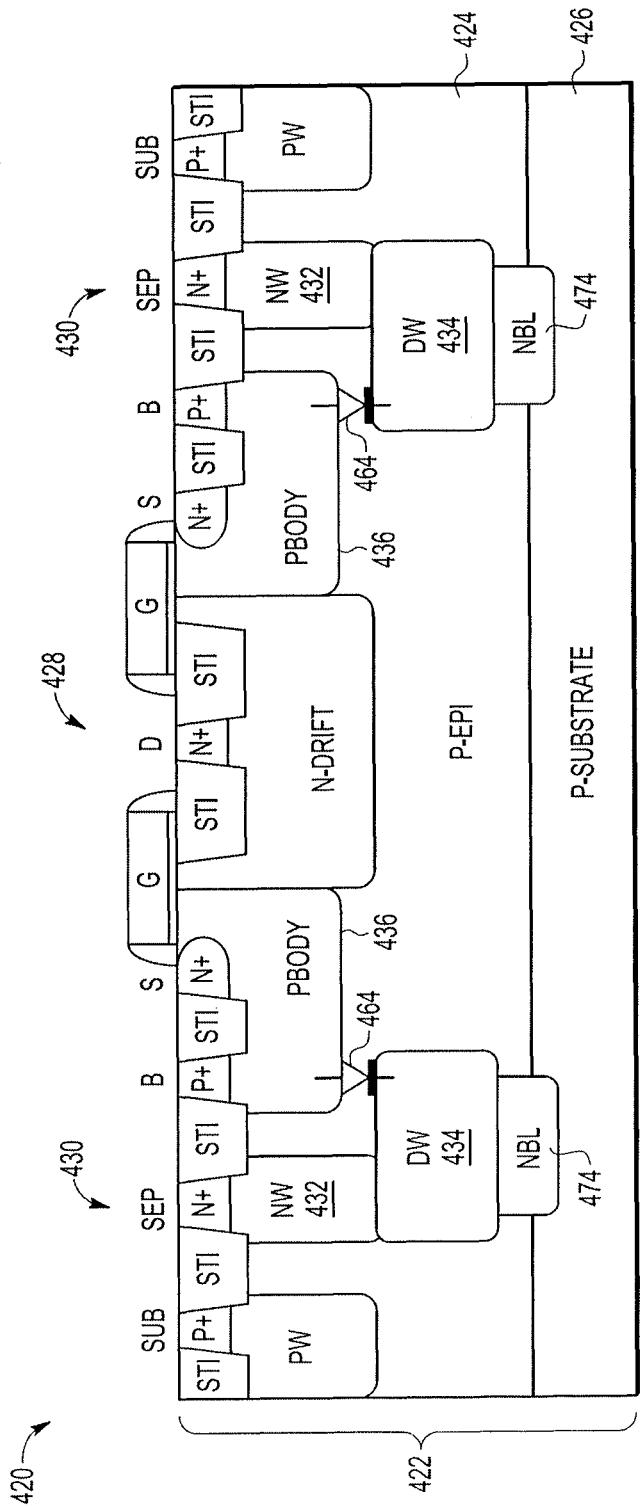
Figure 10:
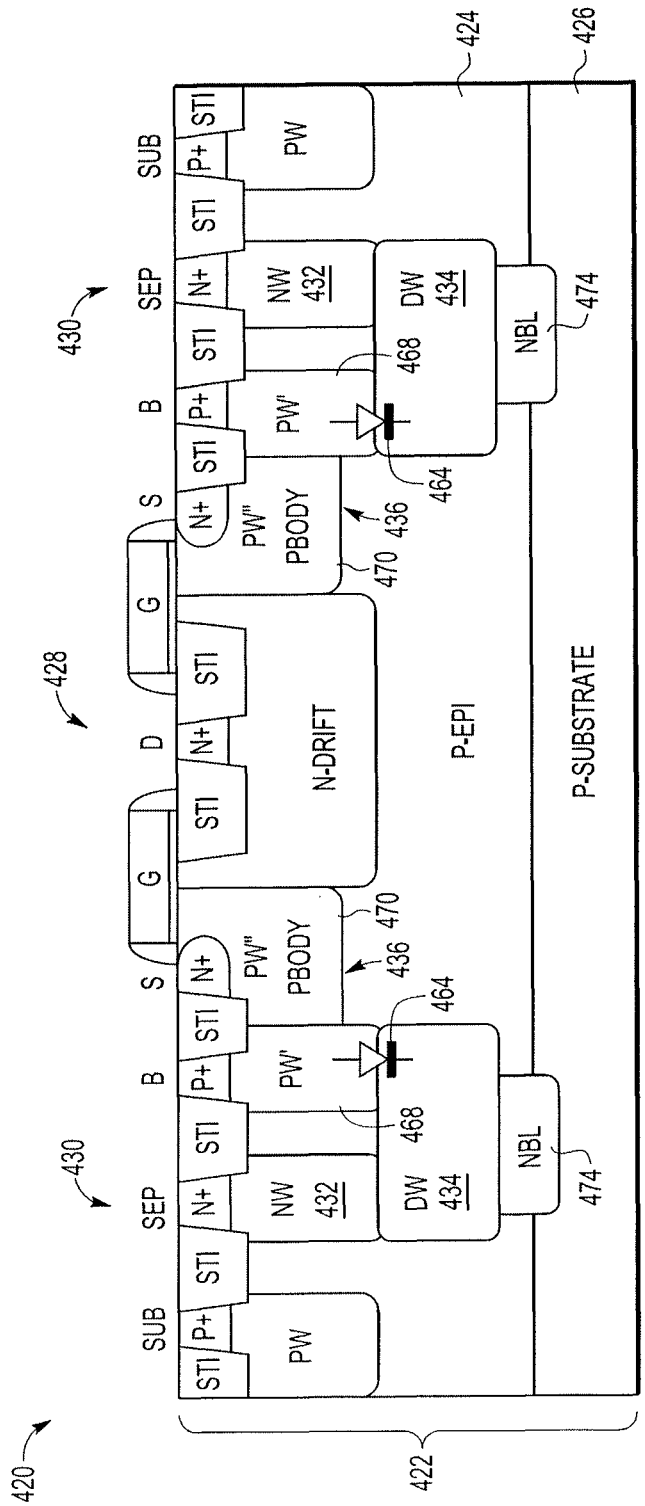
Figure 11:
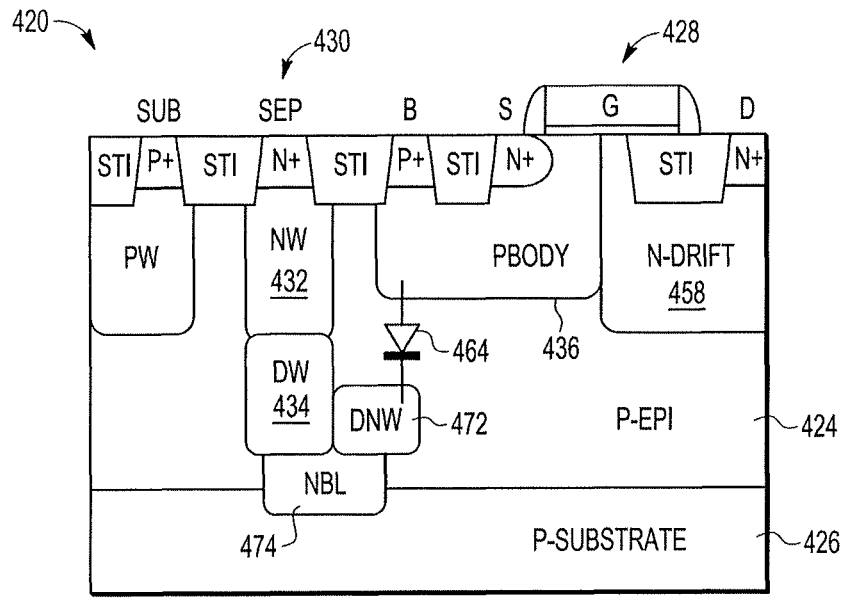
Figure 12:
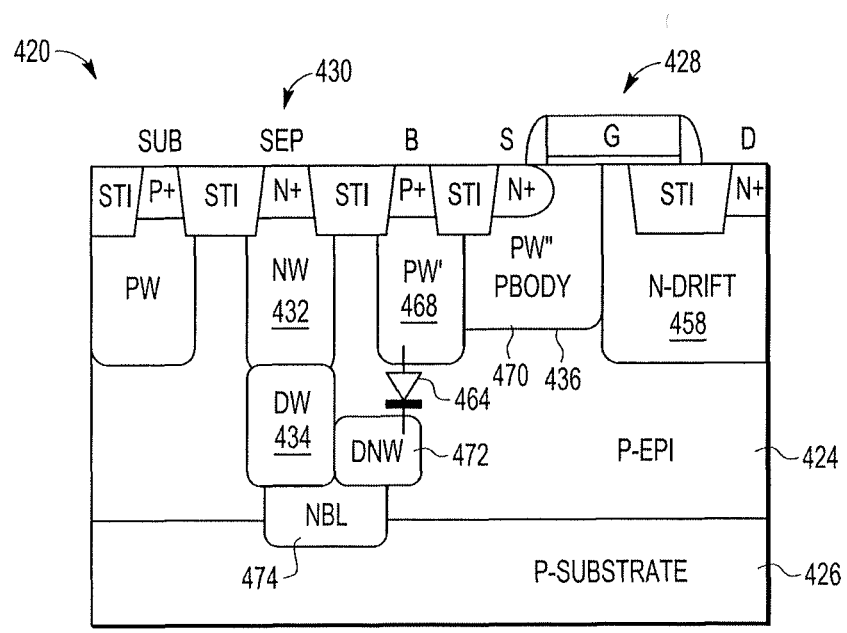

FIGS. 9 and 10 depict transistor devices 420 similar to FIGS. 5 and 6, with the addition of an n-type buried layer (NBL) 474, which is contiguous with the deep well region (DW) 434. FIGS. 11 and 12 depict transistor devices 420 similar to FIGS. 7 and 8, with the addition of the n-type buried layer (NBL) 474, which is contiguous with deep well region (DW) 432 and n-type deep well region (DNW) 472. The addition of the n-type buried layer (NBL) 474 to the separation regions 432, 434 (and optionally, 472) allows the intrinsic device breakdown to be maximized without the limitation imposed by the isolation region underlying the entire active area 428. The inclusion of the n-type buried layer (NBL) 474 can help minimize the disturbance on adjacent circuit elements. During a breakdown event, electron-hole pairs are being generated and some of these generated carriers can diffuse away in the substrate to a neighboring circuit block, which is undesirable. This can be minimized by providing a deeper n-type separation ring (e.g., wall) via the inclusion of an n-type buried layer (NBL) (e.g., 474). Another benefit of including the n-type buried layer (NBL) 474 is that it will reduce the series resistance of the separation regions (e.g., separation ring) and helps achieve a more uniform electric potential throughout the separation regions (e.g., separation ring). In embodiments, the contiguous separation regions can be ring-shaped to surround the active area 428 of the transistor device 420 along the periphery of the active area 428. The buried layer (NBL) 474 can be formed in the epitaxial layer 424 of the semiconductor substrate 422 as shown.

Testing of an embodiment of a power transistor device (e.g., an n-type channel LDMOS device) configured with an integrated protection diode as described herein can be conducted to show that device performance is not adversely affected by breakdown events involving the diode configuration.

Such results can be achieved in a manner that does not affect the design and modeling of the devices. In embodiments, no additional fabrication process steps or procedures are required to be added to a conventional fabrication process for the transistor device. In embodiments of a transistor device having a non-uniform body region (e.g., FIG. 2), the only required modification to the device layout involves a single mask change to form the outer well (PW') 68 of the non-uniform body region (PBODY) 36. The implant procedure implemented with the modified mask can be directed to forming one or more p-type regions of other devices (e.g., logic transistor devices, such as CMOS devices) and, preferably, is already part of the fabrication flow. The integrated nature of the protection diode 64 allows the footprint and routing of the LDMOS device to remain unchanged from LDMOS device prepared without the protection diode.

The dopant concentrations, thicknesses, and other characteristics of the above-described semiconductor regions in the semiconductor substrate can vary. For example, for the embodiment shown in FIG. 1, the semiconductor regions can have the following approximate concentrations and thicknesses:

| | Concentration | Thickness |
| --- | --- | --- |
| P-EPI layer, 24 | $1 \times 10^{15}/cm^3$ | 5 μm |
| Semiconductor substrate, 26 | $1 \times 10^{15}/cm^3$ | Not applicable |
| Separation well region (NW), 32 | $1 \times 10^{17}/cm^3$ | 1 μm |
| Deep well region (DW), 34 | $1 \times 10^{17}/cm^3$ | 3 μm |
| Body region (PBODY), 36 | $1 \times 10^{17}/cm^3$ | 1 μm |
| Source region (S), 40 | $1 \times 10^{21}/cm^3$ | 0.25 μm |
| Drain region (D), 42 | $1 \times 10^{21}/cm^3$ | 0.25 μm |

The concentrations and thicknesses can be different in other embodiments. For example, the dopant concentration of the original substrate 26 can vary considerably.

Figure 13:
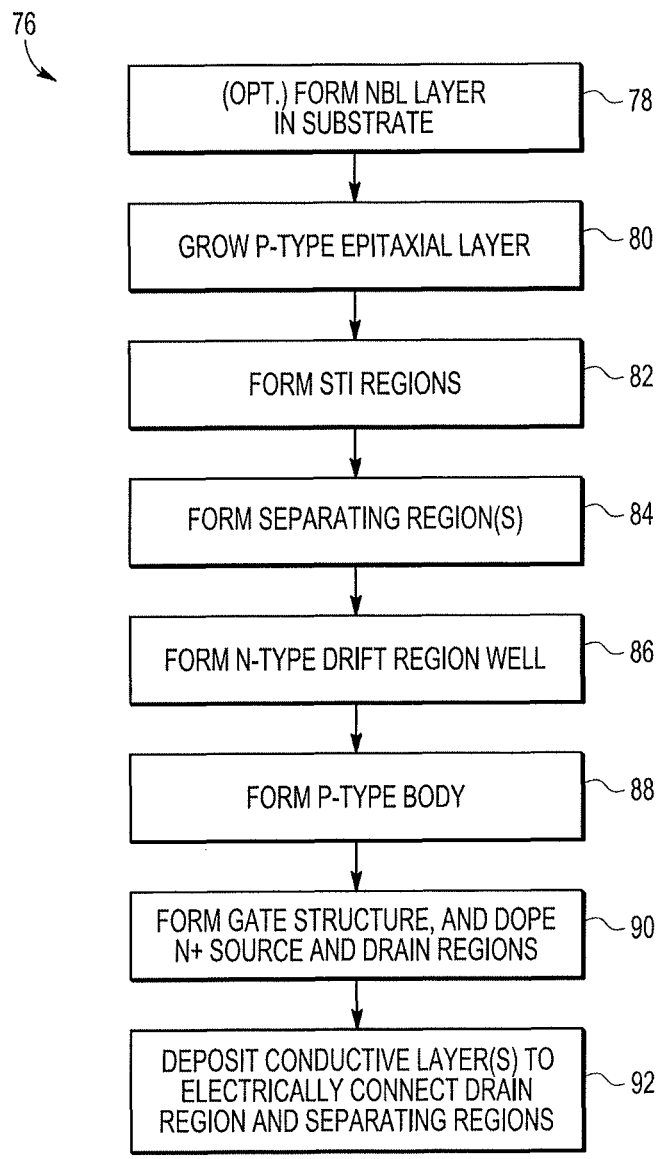
FIG. 13 is flow diagram illustrating a fabrication sequence to construct an n-channel LDMOS transistor with an integrated breakdown protection diode according to an embodiment of the present invention, given by way of example.

FIG. 13 is a flowchart illustrating an embodiment of a method 76 for fabricating a power transistor device with an integrated protection diode as described herein. In embodiments, the method can be directed to fabricating a reduced surface field (RESURF) LDMOS transistor having one or more of the features described herein. The transistor is fabricated with a semiconductor substrate, the regions or layers of which can have the conductivity types of the n-channel examples described herein, or, in other embodiments, the regions or layers can be configured to support a p-channel device. The method includes a series of steps, of which only the significant steps are depicted for convenience in illustration. The ordering of the steps can vary in other embodiments. The fabrication method is not limited to any particular doping mechanism, and can include future developed doping techniques.

For illustrative purposes, the method 76 is described with the formation of epitaxial layers on a substrate (P-SUBSTRATE) 426. The formation of epitaxial layers allows the fabrication of devices with higher breakdown potential but is not essential to the practice of embodiments of the present invention. Embodiments of the present invention can also be practiced in a bulk silicon substrate without epitaxial layers, which imposes limitations on the deepest layer (e.g., NBL or deep well) that can be implanted and the highest breakdown device that can be fabricated.

In embodiments that include an n-type buried layer (NBL) as part of the separating region (e.g., 474 in FIGS. 9-12), at an optional step 78, the buried layer (NBL) can be formed, for example, by ion implantation, in the substrate (P-SUBSTRATE) 426. The buried layer (NBL) can be configured via a mask. In embodiments, the buried layer (NBL) is configured in a ring-shape to surround the active area of the transistor device along the periphery of the active area but not isolate the active area. In embodiments, one or more epitaxial growth steps can be performed prior to the NBL formation. In general, an NBL implant is performed prior to deposition of the last epitaxial layer. In addition, forming an NBL (which is typically heavily doped) directly on a heavily doped substrate may not be desirable where the NBL would limit the breakdown voltage. If a heavily doped substrate is to be used and a high breakdown voltage is desired, an epitaxial layer may be needed before the formation of an NBL.

At step 80, a p-type epitaxial layer (P-EPI) is grown on a p-type semiconductor substrate, which can be heavily doped in some embodiments. As described herein, the epitaxial layer (P-EPI) is optional. Any number of epitaxial layers can be grown to define the semiconductor substrate in which a number of device regions of the device can be formed.

At step 82, one or more STI regions can be grown or otherwise formed at the surface of the semiconductor substrate. Alternatively, the STI regions can be formed after one or more of the regions in the epitaxial layer are formed. The STI regions can be formed via any now known or hereafter developed procedure. For example, a trench can be formed in the substrate, and one or more materials can be deposited (e.g., by chemical vapor deposition, or CVD) in the trench. In some embodiments, the trench is filled with silicon oxide. Additional or alternative materials may be deposited.

At step 84, one or more n-type device separating regions can be formed in the semiconductor substrate to define an active area of the transistor device. In embodiments, a ring-shaped separation well (NW) and one or more deep well (e.g., DNW) regions can be formed. In some embodiments, a buried layer (NBL) can be formed at this time rather than at step 80. In embodiments, each separating region can be formed during a respective ion implantation procedure configured via a mask, which can also be configured for the formation of one or more n-type regions of non-power transistor devices in the semiconductor substrate, such as a CMOS device. For example, the separating regions can include a deep n-type well region (DNW) (see, e.g., 372 in FIGS. 7-8), and the implantation mask can be configured to form a region of another device at a similar depth.

At step 86, an additional n-type region can be formed in the epitaxial layer via another implantation procedure. The additional n-type region can correspond with a drift region (N-DRIFT) of the transistor device. In another embodiment, the drift region (N-DRIFT) can be formed at the same time as one of the separating regions in step 84.

At step 88, a p-type body region (PBODY) can be formed. As described herein, in embodiments, the body region (PBODY) and at least one of the device separating regions are spaced from one another to establish an extrinsic breakdown voltage between the device separating region and the body region (PBODY) that is lower than an intrinsic breakdown voltage of the device in the conduction path of the device. In embodiments in which the body region (PBODY) is non-uniform, step 88 can include multiple implantations. For example, the body region (PBODY) can be formed by implanting a p-type dopant in an inner well region (PW") (on which a source region is later formed) and by implanting p-type dopant in an outer well region (PW') adjacent the inner well region (PW"). The inner well region (PW") can extend and overlap with the outer well region (PW') to any desired extent. In an embodiment, the inner well region (PW") can cover or extend across the entire body region (PBODY). The outer well region (PW') can be spaced from at least one of the device separating regions to establish the breakdown voltage of the protection diode. The inner well region (PW") and the outer well region (PW') can have different dopant concentration levels. The outer well region (PW') can be formed during an implantation procedure that also forms a well of a logic transistor fabricated in the semiconductor substrate. The point at which the implantation procedure(s) are implemented within the fabrication of the transistor device can vary. An implantation procedure can be additionally directed to the formation of a p-type region of another device.

The fabrication process can include one or more procedures collectively shown in step 90. For example, a gate structure (G) can be formed. N-type source (S) and drain (D) regions can then be formed in, on, or otherwise above the body regions (PBODY) and drift region (N-DRIFT), respectively. One or more implantation procedures can be implemented, using the gate structure (G) for self-alignment of structures. For example, formation of one or both of the source region (S) and the drain region (D) can include a moderate implant before formation of sidewall spacers of the gate structure (G) to create one or more transition regions (e.g., NLDD regions). A heavy implant after formation of the sidewall spacers can then be implemented to form the source (S) and/or drain (D) regions adjacent to such transition regions. A heavily doped p-type contact region (B) for the device body region (PBODY) can be formed in the well via a separate ion implantation procedure. The drain region (D) can be spaced from the body region (PBODY) by the drift region (N-DRIFT) and other parts of the conduction path (e.g., the accumulation region). As described herein, the drift region (N-DRIFT) and other parts of the conduction path are spaced from the integrated protection diode(s) defined between the separating region(s) and the body region (PBODY).

At step 92, one or more metal or other conductive layers can then be deposited or otherwise formed, for example, to short or electrically connect the drain region (D) and the device separating regions. The composition and the manner in which the metal layer(s) are formed can vary.

Additional steps can be implemented at various points during the fabrication procedure. For example, one or more steps can be carried out to define an active area of the device. In some embodiments, such steps can include the formation of a device separation well. In embodiments, one or more metal layers can be deposited.

The above-described transistor devices are configured such that breakdown events occur at locations other than, outside of, or otherwise spaced from, the conduction region(s) or path(s) of the device, despite the integrated nature of the breakdown protection diodes. The diodes can be oriented laterally or vertically within the transistor device. The orientation options can provide design flexibility for utilizing preexisting fabrication procedures to form and adjust the protection diodes. The protection diodes are formed to have a breakdown voltage slightly below the intrinsic breakdown voltage (BVdss) of the transistor device to ensure breakdown occurs at the protection diode. The breakdown voltage of the protection diodes can be modified by adjusting the location, spacing, or dopant concentration levels of the regions that define the protection diode. With the drain and the separating regions tied to one another, the drain voltage is clamped at the breakdown voltage of the protection diode. As such, the transistor device can avoid entering a BVdss condition. With the protection diode spaced from the normal current conduction path of the transistor device, a diode breakdown avoids causing destruction or degradation of device performance, such as the device I-V characteristics. With the integration of the protection diode, the size of the protection diode can scale with the transistor device, thereby maintaining protection effectiveness when the width of the transistor device is modified. These and other advantages can be achieved in a manner that does not affect the design or modeling of the transistor device.

In embodiments, the protection diodes can be formed without adding fabrication process steps to a conventional or currently used fabrication process of the device. In some embodiments, the integration of the protection diode is achieved without process modifications other than modifying a standard or currently used mask layout. For example, the protection diode or junction can be formed by changing the layout of a currently used implantation step for forming a separating region or body region of the power transistor device. In another embodiment, the implantation step can be directed to forming a logic device (e.g., a CMOS transistor). With such a modification, a separate implantation step or other fabrication step to form the protection diode or junction, and a resulting increase in cost, can be avoided. In embodiments, the protection diodes can be formed without additions to the device footprint or area.

The protection diode or junction can be integrated with one or more separating regions of the power or high-voltage transistor device (e.g., LDMOS). By locating the protection diode at or along the separating region(s), the breakdown event can be spaced away from a channel or other conduction region of the power transistor device. The position and orientation of the separating region(s) and/or the protection diode or junction can be varied. In some embodiments, breakdown protection is provided via a separating region that leads to a vertically oriented protection diode. For example, the separating region can be fabricated with a deep well that extends partially into the active area of the device. In embodiments in which the diode is vertically oriented, a photolithographic misalignment in forming the diode relative to a deep well region would not necessarily pose a significant problem in the breakdown protection. In other embodiments, breakdown protection is provided via a separating region that leads to a laterally oriented protection diode. In some embodiments, the separating region is structured as a separation ring surrounding the active area. In embodiments, the separating region is electrically tied or shorted with a drain region to reverse bias the diode or junction with the voltage applied to the drain region.

In embodiments, the size (e.g., area) of the protection diode can be scaled, or adjusted, according to the width of the transistor. The scaling or adjustment of the size of the diode can apply to the fabrication of either vertical or lateral oriented protection diode configurations. By scaling the size of the diode according to the size of the transistor, breakdown protection can be effectively maintained over a wide range of power transistor device sizes.

In some embodiments, the breakdown protection is provided by modifying one or more characteristics of a body region of the power transistor device. For example, a portion of the body region can be fabricated or modified to have a non-uniform dopant concentration profile or depth. In embodiments, the portion of the body region having a non-uniform dopant concentration profile or depth can be situated under a body electrode (or contact region) or otherwise spaced from a channel or other conductive region of the transistor device. In embodiments, the portion of the body region can be doped via an implant procedure directed to doping wells of other devices, for example, wells of a logic device (e.g., CMOS devices). For example, the contact region of the body region can be exposed (or opened) during a dopant implant procedure such that the implant for a CMOS well enters a portion of the body region. Other procedures can be used to provide a similar transition or non-uniform dopant concentration in the body region (e.g., between regions near the contact and regions near the channel region). In some embodiments, the portion of the body region having a non-uniform dopant concentration forms part of a vertical diode. In embodiments, the vertical diode can be formed between the body region and an N-type well or region situated adjacent to or underneath the body region. In embodiments, a vertical protection diode can scale with the width of the transistor device to provide an effective breakdown protection for the device.

In some embodiments, the protection diode or junction is oriented laterally and formed in connection with a separation well region that can be configured as a ring surrounding the active area and spaced from the body region. The structure of the separation well region as a ring can vary. In embodiments, the separation well region can include a ring-shaped well region surrounding the active area of the device contiguous with or connected to one or more additional separating regions, for example, a ring-shaped well region and a contiguous deep well region, or a ring-shaped separation well region linked to a deep well region by an intermediate deep well (link) region, among other constructions.

The protection diode can be formed with one or more separating regions used to isolate other transistor devices from the substrate. In some embodiments, a laterally-oriented protection diode can be formed in an epitaxial or other substrate region between a body region of the transistor device and the separation well region (e.g., a ring-shaped separation well region). By adjusting the width of the epitaxial region between the body region and the separation well region, the breakdown voltage of the formed diode or junction can be set or established to fall between the operating voltage and the breakdown voltage near the drain region and/or channel region (e.g., BVdss) of the transistor device. In other embodiments, a separating region (e.g., a deep well region, intermediate deep well (link) region, among others) can be extended relative to a ring-shaped separation well region toward or under the body region to locate the breakdown region between the extended separating region and the body region. For example, the breakdown region can be located along a diagonal path from the body region to a separating region below a trench oxide region, thus avoiding possible charge trapping in the trench oxide during a breakdown event.

In other embodiments, a laterally oriented protection diode or junction can be formed to establish a breakdown voltage by configuring a separating region (e.g., a ring-shaped separation well region) such that a depletion region in the separating region reaches through and contacts an electrode of the separating region under sufficiently high reverse bias. In other embodiments, the transistor device can be configured such that a depletion region reaches through and contacts an electrode (or contact region) of the body region. In each of these and other internal locations, the protection diode or junction can scale with the width of the transistor device.

It should be appreciated that the present invention is intended to encompass numerous embodiments. For example, in embodiments, the invention relates to a semiconductor device comprising a semiconductor substrate having a first conductivity type, a device separating region in the semiconductor substrate and having a second conductivity type, the device separating region defining an active area and extending in a vertical orientation in the substrate along a periphery of the active area but not extending across the active area in a lateral orientation in the substrate to isolate the active area, (e.g., non-fully isolated) a body region in the active area and having the first conductivity type, and a drain region in the active area and having the second conductivity type, the drain region spaced from the body region to define a conduction path of the device. In embodiments, spacing between the device separating region and the body region establishes a first breakdown voltage lower than a second breakdown voltage in the conduction path. In embodiments, the device separating region and/or the body region are formed with their respective single implants. In some embodiments, the device separating region and/or the body region is a composite region comprising a plurality of contiguous, constituent regions defining a non-uniformity.

In embodiments, the device separating region is a composite region and comprises a separation well region and one or more contiguous deep well regions. In embodiments, the separation well region and the contiguous deep well region(s) can have different dopant concentration levels. In embodiments, the separation well region is configured as a ring surrounding the active area and spaced from the body region to establish the first breakdown voltage. In embodiments, at least one of the contiguous deep well regions is spaced from the body region to establish the first breakdown voltage. In embodiments, at least one constituent deep well region extends laterally inward toward or under the body region. In embodiments, the device separating region comprises a deep well region linking the separation well region and a second deep well region. In embodiments, the intermediate deep well region or the second deep well region extends laterally inward toward or under the body region to define the spacing to establish the first breakdown voltage.

In embodiments, the body region is a composite region and comprises a first well on which a source region having the second conductivity type is disposed, and a contiguous second well adjacent the first well, and the second well of the body region is spaced from one of said contiguous regions of the device separating region to establish the first breakdown voltage. In embodiments, the first well and the second well of the body region have different dopant concentration levels. In embodiments, the conduction path is configured such that the device is a laterally diffused metal-oxide-semiconductor (LDMOS) device. In embodiments, the device separating region is electrically tied to the drain region such that the drain region is clamped to the first breakdown voltage during a breakdown event.

In another aspect, embodiments of the present invention relate to an electronic apparatus that includes a substrate having a first conductivity type, and a transistor device disposed in the substrate. The transistor includes a first semiconductor region [e.g., SEP region] having a second conductivity type and defining an active area of the transistor, and extending in a vertical orientation in the substrate along a periphery of the active area but not extending across the active in a lateral orientation to isolate the active area in the substrate; a second semiconductor region [e.g., N-DRIFT] in the active area and having the second conductivity type; a third semiconductor region [e.g., PBODY] in the active area and having the first conductivity type; and a fourth semiconductor region [e.g., DRAIN] having the second conductivity type and situated adjacent to the second semiconductor region. A spacing between the first and third semiconductor regions defines a diode depletion region having a first breakdown voltage lower than a second breakdown voltage. In embodiments, at least one of the first and third semiconductor regions is a composite region comprising a plurality of continuous, constituent regions to establish a non-uniformity.

In embodiments, the electronic apparatus can further comprise a fifth semiconductor region [SOURCE] in the active area and having the second conductivity type, wherein the third semiconductor region comprises a first well on which the fifth semiconductor region is disposed and a second well adjacent the first well and spaced from the first semiconductor region to establish the first breakdown voltage. In embodiments, the first well and the second well of the third region have different dopant concentration levels. In embodiments, the first semiconductor region comprises a separation well configured as a ring surrounding the active area and spaced from the third semiconductor region to establish the first breakdown voltage. In embodiments, the first semiconductor region [SEP region] is a composite and comprises a separation well region in the substrate, a deep well region, and an intermediate well region. In embodiments, the separation well region can be configured as a ring surrounding the active area, and the intermediate well region can link the separation well region and the deep well region. In embodiments, at least one of the intermediate well region and the deep well region extends laterally inward beyond the separation well region and toward or under the third semiconductor region to define a spacing between the first and the third semiconductor regions that defines the first breakdown voltage. In embodiments, the first semiconductor region includes a well and a contact region formed on the well, and a depletion region is formed between the first semiconductor region and the third semiconductor region that reaches the contact region at the first breakdown voltage.

In another aspect, embodiments of the present invention are directed to methods of fabricating a non-isolated transistor, the method comprising: forming a device separating region of the transistor in a semiconductor substrate, the substrate having a first conductivity type, the device separating region having a second conductivity type and defining an active area of the transistor; the device separating regions extending in a vertical orientation in the substrate but not across the active area in a lateral orientation to isolate the active area; forming a body region of the transistor in the active area, the body region having the first conductivity type; and forming source and drain regions of the transistor in the active area, the source region being situated on the body region, and the source and drain regions having the second conductivity type. In embodiments, at least one of the body region and the device separating region is a composite region comprising a plurality of contiguous, constituent regions that define a non-uniformity. In embodiments, at least one of said constituent regions defines a spacing between the device separating region and the body region to establish a first breakdown voltage lower than a second breakdown voltage in a conduction path between the source and drain regions. In embodiments, forming the body region comprises implanting dopant of the first conductivity type in a first well region of the body region on which the source region is disposed, and implanting the dopant of the first conductivity type in a second well region adjacent the first well region and spaced from the device separating region to establish the first breakdown voltage.

The terms "top," "bottom," "over," "under," "overlying," "underlying," and the like in the description and in the claims, if any, are used for descriptive purposes and not necessarily for describing permanent relative positions. It is understood that the terms so used are interchangeable under appropriate circumstances such that embodiments of the invention described herein are, for example, capable of operation in other orientations than those illustrated or otherwise described herein.

The terms "a" or "an," as used herein, are defined as one or more than one. Also, the use of introductory phrases such as "at least one," "at least two," and "one or more" in the claims should not be construed to imply that the introduction of another claim element by the indefinite articles "a" or "an" limits any particular claim containing such introduced claim element to devices, etc., containing only one such element, even when the same claim includes the introductory phrases "one or more" or "at least one" and indefinite articles such as "a" or "an." The same applies to the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required or essential feature or element of any or all of the claims.

What is claimed:

1. A device comprising:
a semiconductor substrate having a first conductivity type;
a device separating region in the semiconductor substrate and having a second conductivity type, the device separating region defining an active area and extending in a vertical orientation in the substrate along a periphery of the active area but not extending across the active area in a lateral orientation in the substrate to isolate the active area;
a body region in the active area and having the first conductivity type; and
a drain region in the active area and having the second conductivity type, the drain region spaced from the body region to define a conduction path of the device;
wherein a spacing between the device separating region and the body region establishes a first breakdown voltage lower than a second breakdown voltage in the conduction path.

2. The device of claim 1, wherein the device separating region is a composite region and comprises a separation well region and one or more contiguous deep well regions.

3. The device of claim 2, wherein the separation well region and the one or more contiguous deep well regions have different dopant concentration levels.

4. The device of claim 2, wherein the separation well region is configured as a ring surrounding the active area and spaced from the body region to establish the first breakdown voltage.

5. The device of claim 2, wherein at least one of the contiguous deep well regions is spaced from the body region to establish the first breakdown voltage.

6. The device of claim 5, wherein said at least one constituent deep well region extends laterally inward toward or under the body region.

7. The device of claim 2, wherein the device separating region comprises an intermediate deep well region linking the separation well region and a second deep well region.

8. The device of claim 7, wherein the intermediate deep well region or the second deep well region extends laterally inward toward or under the body region to define the spacing to establish the first breakdown voltage.

9. The device of claim 1, wherein the body region is a composite region, and comprises:
a first well on which a source region having the second conductivity type is disposed, and
a contiguous second well adjacent the first well, and the second well of the body region is spaced from one of said contiguous regions of the device separating region to establish the first breakdown voltage.

10. The device of claim 9, wherein the first well and the second well of the body region have different dopant concentration levels.

11. The device of claim 1, wherein the conduction path is configured such that the device is a laterally diffused metal-oxide-semiconductor (LDMOS) device.

12. The device of claim 1, wherein the device separating region is electrically tied to the drain region such that the voltage at the drain region is clamped to the first breakdown voltage during a breakdown event.

13. An electronic apparatus comprising:
a semiconductor substrate having a first conductivity type; and
a transistor disposed in the semiconductor substrate, the transistor comprising:
a first semiconductor region having a second conductivity type and defining an active area of the transistor, and extending in a vertical orientation in the substrate along a periphery of the active area but not extending across the active in a lateral orientation to isolate the active area in the substrate;
a second semiconductor region in the active area and having the second conductivity type;
a third semiconductor region in the active area and having the first conductivity type; and
a fourth semiconductor region having the second conductivity type and situated adjacent to the second semiconductor region;
wherein a spacing between the first and third semiconductor regions defines a diode depletion region having a first breakdown voltage lower than a second breakdown voltage.

14. The electronic apparatus of claim 13, further comprising a fifth semiconductor region in the active area and having the second conductivity type, wherein the third semiconductor region comprises a first well on which the fifth semiconductor region is disposed and a second well adjacent the first well and spaced from the first semiconductor region to establish the first breakdown voltage.

15. The electronic apparatus of claim 14, wherein the first well and the second well of the third region have different dopant concentration levels.

16. The electronic apparatus of claim 13, wherein the first semiconductor region comprises a separation well configured as a ring surrounding the active area and spaced from the third semiconductor region to establish the first breakdown voltage.

17. The electronic apparatus of claim 13, wherein the first semiconductor region is a composite and comprises a separation well region in the substrate, a deep well region, and an intermediate well region; and the separation well region is configured as a ring surrounding the active area;
the intermediate well region links the separation well region and the deep well region; and
at least one of the intermediate well region and the deep well region extends laterally inward beyond the separation well region and toward or under the third semiconductor region to define a spacing between the first and the third semiconductor regions that defines the first breakdown voltage.

18. The electronic apparatus of claim 17, wherein:
the first semiconductor region includes a well and a contact region formed on the well; and
a depletion region is formed between the first semiconductor region and the third semiconductor region that reaches the contact region at the first breakdown voltage.

* * * * *